US009653298B2

(12) United States Patent
Hoult et al.

(10) Patent No.: US 9,653,298 B2
(45) Date of Patent: May 16, 2017

(54) THERMAL PROCESSING BY TRANSMISSION OF MID INFRA-RED LASER LIGHT THROUGH SEMICONDUCTOR SUBSTRATE

(71) Applicant: IPG Photonics Corporation, Oxford, MA (US)

(72) Inventors: Anthony P. Hoult, Santa Clara, CA (US); Heinrich Endert, Santa Clara, CA (US)

(73) Assignee: IPG Photonics Corporation, Oxford, MA (US)

( * ) Notice: Subject to any disclaimer, the term of this patent is extended or adjusted under 35 U.S.C. 154(b) by 669 days.

(21) Appl. No.: 13/740,463

(22) Filed: Jan. 14, 2013

(65) Prior Publication Data
US 2014/0199858 A1 Jul. 17, 2014

(51) Int. Cl.
*H01L 21/268* (2006.01)
(52) U.S. Cl.
CPC .................................. *H01L 21/268* (2013.01)
(58) Field of Classification Search
None
See application file for complete search history.

(56) References Cited

U.S. PATENT DOCUMENTS

| | | | |
|---|---|---|---|
| 5,047,365 A | | 9/1991 | Kawanaka et al. |
| 5,569,398 A | | 10/1996 | Sun et al. |
| 5,909,306 A | * | 6/1999 | Goldberg et al. .......... 359/337.1 |
| 7,414,224 B2 | | 8/2008 | Aderhold et al. |
| 7,642,205 B2 | | 1/2010 | Timans |
| 2003/0087476 A1 | * | 5/2003 | Oohata ...................... G09F 9/33 438/108 |
| 2004/0056350 A1 | * | 3/2004 | Ruben .......................... 257/734 |

(Continued)

FOREIGN PATENT DOCUMENTS

| | | |
|---|---|---|
| EP | 1098751 A1 | 5/2001 |
| WO | 2012143207 A1 | 10/2012 |

OTHER PUBLICATIONS

International Search Report and Written Opinion mailed May 13, 2014, received in corresponding PCT Application No. PCT/US14/11426, 8 pgs.

(Continued)

*Primary Examiner* — Julio J Maldonado
*Assistant Examiner* — Stanetta Isaac
(74) *Attorney, Agent, or Firm* — Grossman Tucker Perreault & Pfleger, PLLC

(57) ABSTRACT

Thermal processing is performed by transmission of mid infra-red laser light through a substrate such as a semiconductor substrate with a limited mid infra-red transmission range. The laser light is generated by a rare-earth-doped fiber laser and is directed through the substrate such that the transmitted power is capable of altering a target material at a back side region of the substrate, for example, on or spaced from the substrate. The substrate may be sufficiently transparent to allow the transmitted mid infra-red laser light to alter the target material without altering the material of the substrate. In one example, the rare-earth-doped fiber laser is a high average power thulium fiber laser operating in a continuous wave (CW) mode and in a 2 μm spectral region.

20 Claims, 2 Drawing Sheets

(56) References Cited

U.S. PATENT DOCUMENTS

| | | | |
|---|---|---|---|
| 2008/0026543 A1* | 1/2008 | Miyairi | H01L 27/1266 |
| | | | 438/455 |
| 2009/0121157 A1 | 5/2009 | Moffatt et al. | |
| 2009/0296743 A1 | 12/2009 | Islam | |
| 2011/0111179 A1* | 5/2011 | Blick | B23K 26/18 |
| | | | 428/172 |
| 2011/0275195 A1 | 11/2011 | Meade | |
| 2011/0300651 A1* | 12/2011 | Kojima et al. | 438/29 |
| 2012/0268817 A1 | 10/2012 | Kozlov | |
| 2012/0300797 A1* | 11/2012 | Durkin et al. | 372/6 |
| 2013/0280440 A1* | 10/2013 | Zhang | 427/554 |

OTHER PUBLICATIONS

Hoult, Tony, "Investigations Into Material Behavior and Material Processing With High Brightness Laser Beams in the 2 Micron Spectral Range", ScienceDirect, Physics Procedia 00 (2013) 000-000, 2 pgs.

Ito, Yoshiro et al., "Micromachining Through Silicon Substrates by Ultrafast Laser at 1552 NM", Paper # N103, Department of Mechanical Engineering, Nagaoka University of Technology, Japan, Sep. 2012, pp. 1102-1107.

Park, Jong-Seung et al., "Transmission Laser Bonding of Glass With Silicon Wafer", Department of Mechanical and Aerospace Engineering, Arizona State University, USA Symposium on Flexible Automation, Denver, Colorado, Jul. 19-21, 2004, pp. 1-7.

\* cited by examiner

THERMAL PROCESSING BY TRANSMISSION OF MID INFRA-RED LASER LIGHT THROUGH SEMICONDUCTOR SUBSTRATE

BACKGROUND OF THE DISCLOSURE

Field of the Disclosure

The present invention relates to thermal processing using lasers and more particularly, to thermal processing by transmission of mid infra-red laser light through a semiconductor substrate.

Background Art Discussion

Lasers have been used to perform a wide range of material processing to alter a material in some way, for example, by ablation, melting and annealing. In particular, the material may be heated by the absorption of laser energy until the material evaporates, liquefies, or otherwise changes its state or structure. Laser thermal processing has been used in semiconductor manufacturing to machine, separate, bond and treat semiconductor materials for various applications such as the manufacture of LEDs, laser diodes, and other semiconductor devices. Such applications often present challenges because of the small sizes of these devices, the precision required, and the nature of the semiconductor materials that are used.

One way to provide sufficient laser energy for thermally processing materials during semiconductor manufacturing applications, for example, is to direct laser light with a direct line of sight at the material to be processed. In some cases, however, a direct line of sight may not be possible or may result in a more complex and expensive manufacturing process. Attempts at transmitting laser light through certain types of semiconductor substrates, such as silicon, to process materials on the back side of the substrates have failed because the laser light in the spectral range transmitted by the semiconductor material was not able to be transmitted with sufficient power to effect thermal processing. Such backside processing using conventional methods has been limited to certain types of highly transmissive materials with a wide transmission range and/or ultrashort pulses.

Accordingly, there is a need for a method for thermal processing by transmission of laser light through less transmissive semiconductor materials, such as silicon.

SUMMARY OF THE DISCLOSURE

Consistent with one embodiment, a method is provided for thermal processing by mid infra-red laser transmission. The method includes: generating laser light from a rare-earth-doped fiber laser in a spectral range of 1300 to 5000 nm; and directing the laser light through a semiconductor substrate, the semiconductor substrate being sufficiently transparent to the laser light in the spectral range of 1300 to 5000 nm such that the laser light transmitted through the semiconductor substrate has a transmitted power capable of altering a target material at a back side region of the semiconductor substrate.

Consistent with another embodiment, a method of thermal processing by mid infra-red laser transmission includes: generating continuous wave (CW) laser light from a thulium fiber laser in a 2 µm spectral region; and directing the laser light through a substrate, the substrate being sufficiently transparent to the laser light in the 2 µm spectral region such that the laser light transmitted through the substrate has a transmitted power capable of altering a target material at a back side region of the substrate without altering material of the substrate.

BRIEF DESCRIPTION OF THE DRAWINGS

These and other features and advantages will be better understood by reading the following detailed description, taken together with the drawings wherein.

DETAILED DESCRIPTION

Figure 1:
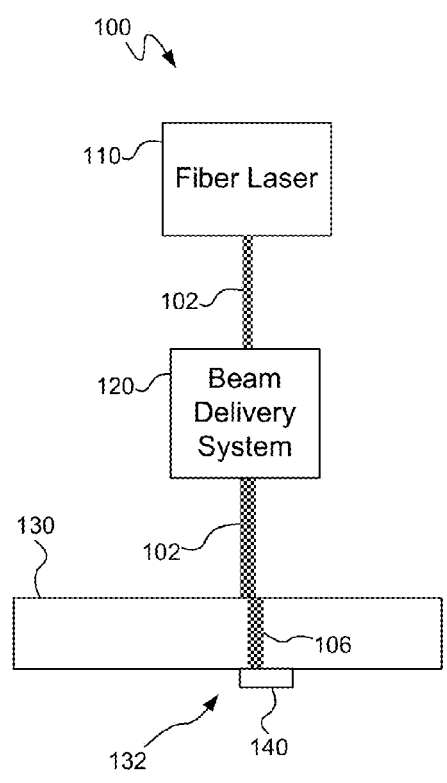
FIG. 1 is a schematic diagram of a backside laser thermal processing system, consistent with an embodiment of the present disclosure.

Thermal processing is performed, consistent with embodiments of the present disclosure, by transmission of mid infra-red laser light through a substrate such as a semiconductor substrate with a limited mid infra-red transmission range. The laser light is generated by a rare-earth-doped fiber laser and is directed through the substrate such that the transmitted power is capable of altering a target material at a back side region of the substrate, for example, on or spaced from the substrate. The substrate may be sufficiently transparent to allow the transmitted mid infra-red laser light to alter the target material without altering the material of the substrate. In one example, the rare-earth-doped fiber laser is a high average power thulium fiber laser operating in a continuous wave (CW) mode and in a 2 µm spectral region.

As used herein, "mid infra-red" refers to a spectral range of 1300 nm to 5000 nm and "mid infra-red laser light" refers to light generated by a laser with a wavelength in this spectral range. "Limited mid infra-red transmission range" refers to an ability of a material to transmit laser light in at least a portion of the mid infra-red range with greater than 40% transmittance but with less than 10% transmittance for at least a portion of infra-red wavelengths lower than 1200 nm. Examples of semiconductor materials with a limited mid-infra-red transmission range include, without limitation, silicon (Si) and gallium arsenide (GaAs). As used herein, "2 µm spectral region" refers to a portion of the mid infra-red spectral range between 1900 and 2050 nm. As used herein, "altering the material" refers to changing or modifying properties or characteristics of the material and includes, without limitation, ablating, annealing (including all kinds of re-crystallization from solid-state phase to re-melting), melting, curing and softening and "thermal processing" or "thermally process" refers to the use of heat absorbed in the material from laser energy to alter the material.

Thermal processing by mid infra-red laser transmission through a semiconductor substrate may be used for a wide range of applications, for example, in the manufacture of light emitting diodes, laser diodes, and other semiconductor devices. One application includes scribing or machining a target substrate on a backside region of the semiconductor substrate when a direct line of site to the target substrate is not possible. Another application includes bonding to the backside region of the semiconductor substrate by transmitting the laser through the semiconductor substrate to thermally process a bonding material deposited on the back side of the substrate. A further application includes laser lift off (LLO) for separation of one or more semiconductor layers from the semiconductor substrate by transmitting the laser through the semiconductor substrate to an interface between the substrate and the layers. Yet another application includes laser transfer deposition for transferring a film or layer from the semiconductor substrate to another substrate by transmitting the laser through the semiconductor substrate. Other applications are also possible.

Figure 2:
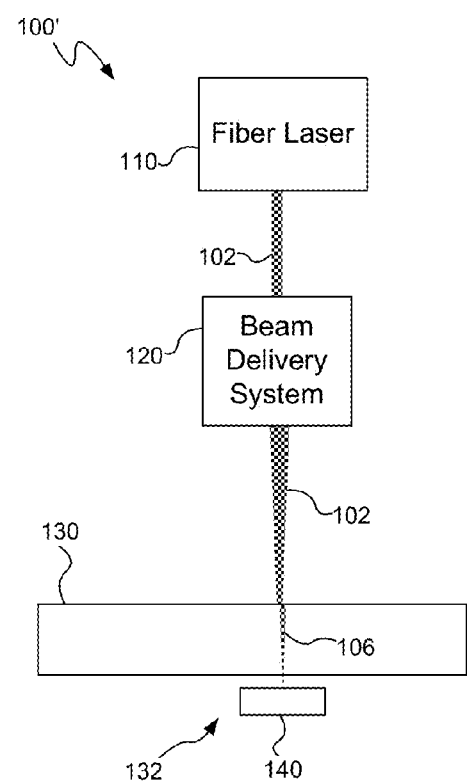
FIG. 2 is a schematic diagram of a backside laser thermal processing system, consistent with another embodiment of the present disclosure.

Referring to FIGS. 1 and 2, a backside laser thermal processing system 100, 100', consistent with embodiments of the present disclosure, generally includes a rare-earth-doped fiber laser 110 that generates mid infra-red laser light 102. The backside laser thermal processing system 100, 100' also includes a beam delivery system 120 that directs the mid infra-red laser light 102 through a semiconductor substrate 130 such that at least a portion of the mid infra-red laser light (i.e., transmitted mid infra-red laser light 106) reaches a back side region 132 of the substrate 130. The mid infra-red laser light 102 has an input power and the semiconductor substrate 130 is sufficiently transparent to the mid infra-red laser light 102 such that the transmitted mid infra-red laser light 106 has a transmitted power capable of altering a target material 140 at the back side region 132 of the substrate 130.

The semiconductor substrate 130 may include semiconductor materials with a limited mid infra-red transmission range, such as a Si wafer or a GaAs wafer. The methods described herein may also be used with other types of materials that allow transmission of mid infra-red laser light including, such as sapphire. The target material 140 may be a semiconductor material or any other material capable of being thermally processed by the transmitted laser light 106 including, without limitation, a polymeric material. Although the target material 140 is shown with a relatively smaller size compared to the semiconductor substrate 130, the target material 140 may be the same size or larger than the semiconductor substrate 130. Also, the target material 140 may include multiple different layers or segments of material of the same or different types.

The target material 140 may be coated or deposited directly on the semiconductor substrate 130, as shown in FIG. 1. The target material 140 may include, for example, a bonding material deposited on the semiconductor substrate 130 for bonding between the semiconductor substrate 130 and another structure (not shown) after being heated and softened by the laser light. The target material 140 may also include one or more additional layers of semiconductor materials deposited on the semiconductor substrate 130, which may be machined through the substrate 130 or separated from the substrate 130 (e.g., by ablating an interface of the target material 140 and the substrate 130).

The target material 140 may also be spaced from the semiconductor substrate 130, as shown in FIG. 2. When the target material 140 is spaced from the semiconductor substrate 130, the target material 140 is within sufficient proximity to perform the desired thermal processing. The target material 140 spaced from the semiconductor substrate 130 may be another substrate, an object, or a device or portion of a device, for example, in a semiconductor device package.

Although the methods described herein are capable of altering the target material 140 without altering the semiconductor substrate 130, the mid infra-red laser light 102 may be focused such that the laser light alters a portion of the semiconductor substrate 130 as the laser light is transmitted through the substrate. For example, the mid infra-red laser light 102 may ablate a front side surface of the semiconductor substrate 130 and then may be transmitted through the semiconductor substrate 130 to process the target material 140 on the back side. In other embodiments, the mid infra-red laser light 102 may process layers on the front side (not shown) and the back side of the semiconductor substrate 130, for example, by scribing the front side layer, transmitting through the substrate 130 and then scribing the back side layer.

In some embodiments, the rare-earth-doped fiber laser 110 may include a high average power thulium fiber laser operating in the 2 μm spectral region (e.g., a 120 watt 1940 nm thulium fiber laser). Other types of rare-earth-doped fiber lasers 110 may also be used such as erbium-doped fiber lasers capable of producing mid infra-red laser light (e.g., a 1540 nm erbium-doped fiber laser). Lasers capable of producing an average power up to 120 W in the 2 μm spectral region and up to 500 W in the 1.5 μm spectral region are commercially available.

The rare-earth-doped fiber laser 110 may produce continuous wave (CW) laser light, temporally modulated CW laser light, or pulsed laser light. The rare-earth-doped fiber laser 110, such as a high average power thulium fiber laser, produces sufficient power for thermal processing even when using CW mid infra-red laser light or when using pulsed or temporally modulated CW laser light with longer pulses that are greater than 1 nanosecond. Thus, the methods described herein provide an advantage over other methods requiring shorter wavelengths and/or shorter pulses to obtain sufficient power for thermal processing by transmission through a substrate.

One type of thulium fiber laser that may be used is a high power single mode fiber laser system for wavelengths operating in the 2 μm spectral region such as the type described in greater detail in International Application Publication No. WO/2012/150935, which is fully incorporated herein by reference. This type of high power fiber laser system is configured with a pump cascade and a laser cascade. The pump cascade includes a fiber amplifier provided with a multimode (MM) core doped with ions of a rare-earth element including either erbium (Er) or ytterbium/erbium (Yb/Er) and having a double bottleneck-shaped cross section. The laser cascade has a fiber laser configured with a core that is doped with thulium (Tm) ions. The double bottleneck-shaped fiber amplifier couples pump light into the upstream end of the Tm fiber laser. Other rare-earth-doped fiber lasers may also be used for generating mid infra-red laser light at wavelengths in a spectral range of 1300 to 5000 nm.

The beam delivery system 120 may include optics for modifying and/or directing the laser light to the desired location. Such optics may include, without limitation, focal lenses, beam expanders, beam collimators, beam shaping lenses, reflectors, masks, beamsplitters and scanners (e.g., a galvanometer). The beam delivery system 120 may direct a stationary beam of laser light 102 through the substrate 130 or may scan the beam of laser light 102 across the substrate, for example, using a galvanometer or other scanner. The beam delivery system 120 may also deliver a beam of laser light 102 with a wide range of sizes and shapes of beam spots on the target material 140. The beam spot size and/or shape may be configured or adjusted to generate a range of different fluences on the target material 140. The beam size may include larger sizes (e.g., 5 mm diameter or greater) for thermal processing of larger areas or smaller focused beams (e.g., less than 100 μm) to target smaller areas on the back side of the semiconductor wafer for localized treatment.

As shown in FIG. 1, the beam delivery system 120 may direct a collimated beam of laser light 102 through the semiconductor substrate 130. In other embodiments, as shown in FIG. 2, for example, the beam delivery system 120 may include one or more focal lenses to focus the beam of laser light 102 and direct the focused, converging beam of laser light 102 through the semiconductor substrate 130. The beam of laser light 102 (e.g., either collimated or diverging) is also refracted by the semiconductor substrate 130 and may be modified according to the crystal orientation of the semiconductor material. Thus, the beam delivery system 120 may account for any shift in the transmitted laser light 106 when directing the laser light 102 to the substrate 130 for transmission to the target material 140.

The beam delivery system 120 may also shape the beam, for example, using a mask or beam shaping optics. One example of a beam delivery system 120 may include beam shaping optics for producing an astigmatic focal beam spot, such as the type disclosed in greater detail in U.S. Pat. No. 7,388,172, which is fully incorporated herein by reference. A further example of a beam delivery system 120 may include beam shaping optics for patterned laser lift off (LLO), such as the type disclosed in greater detail in U.S. Pat. No. 7,846,847 and in U.S. Patent Application Publication No. 2011/0132549, which are fully incorporated herein by reference.

In other embodiments, the backside laser processing system 100, 100' may also include workpiece supports and stages (not shown) for supporting and moving the substrate. The workpiece supports and stages may move the substrate 130, for example, to scribe the target material 140 on the backside region 132 of the substrate 130. The backside laser processing system 100, 100' may also include vision inspection systems for monitoring the processing and control systems for controlling the laser 110, the beam delivery system 120, and/or the workpiece supports and stages.

Methods of thermal processing by mid infra-red laser transmission, consistent with embodiments of the present disclosure, generally include generating mid infra-red laser light 102, for example, in the 1700 to 3000 nm range and more particularly in the 2 μm spectral region. The thermal processing methods further include directing the mid infra-red laser light 102 through the semiconductor substrate 130 such that the transmitted power is capable of altering the target material 140 on the back side region 132 of the substrate 130. The transmitted power needed for altering the target material 140 may depend on the material properties, such as the melting temperature (Tm) and glass transition temperature (Tg). The transmitted power is generally a function of the input power and the material and thickness of the substrate 130 through which the laser light is transmitted. Depending upon the material and thickness of the substrate 130, embodiments of the system and method described herein may be capable of transmitting as much as 30%, 55% or 80% of the input power.

According to one example, a 1940 nm continuous wave laser beam is generated by a thulium fiber laser, such as the high average power single mode fiber laser system described above, and transmitted through a monocrystalline silicon (Si) wafer. In this example, a 120 watt average power CW laser beam having a 5 mm diameter transmits about 55% of the input power through a 1 mm thick monocrystalline Si wafer and about 30% of the input power through a 2 mm thick monocrystalline Si wafer.

According to another example, a 1940 nm continuous wave laser beam is generated by a thulium fiber laser, such as the high average power single mode fiber laser system described above, and transmitted through a monocrystalline gallium arsenide (GaAs) wafer. In this example, the transmitted powers resulting from different input powers transmitted through a 0.65 mm thick GaAs wafer are shown in Table I below. As shown, up to 80% of the input power may be transmitted through the GaAs wafer in this example.

TABLE I

| Input Power, W | Transmitted Power, W |
|---|---|
| 35.8 | 28.5 |
| 47.2 | 30.4 |
| 58.9 | 32.2 |
| 70.1 | 42.5 |
| 82.1 | 54.0 |

Figure 3:
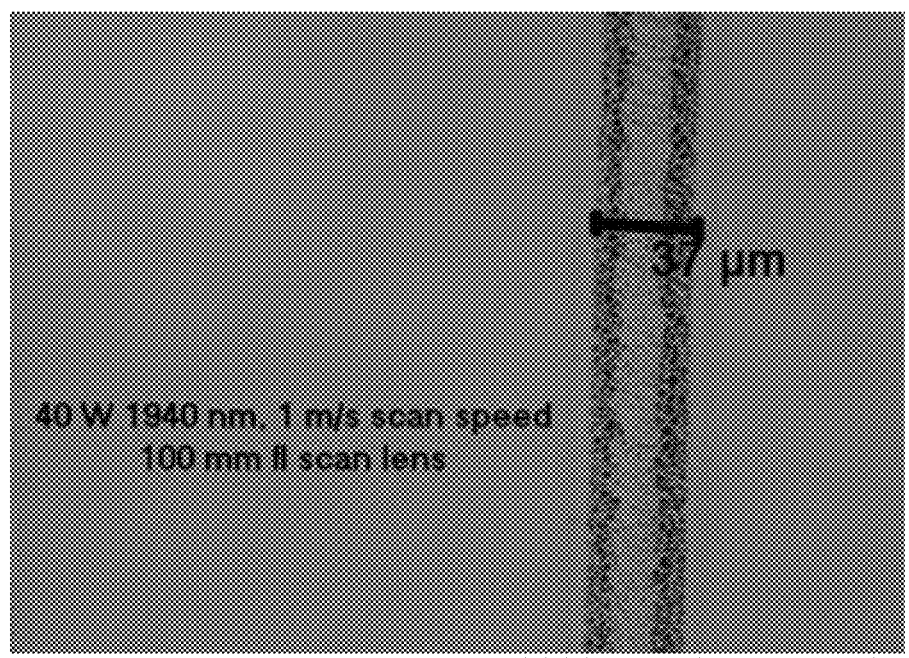
FIG. 3 is an image of a scribe formed in a target germanium wafer by mid infra-red laser transmission through a gallium arsenide wafer, consistent with an embodiment of the present disclosure.

According to a further example, the 1940 nm CW laser beam generated by the thulium laser is transmitted through the GaAs wafer and scanned to scribe a germanium (Ge) wafer on the backside regions of the GaAs wafer. FIG. 3 shows an image illustrating a scribe line produced in the Ge wafer by focusing a 40 W beam of 1940 nm CW laser light using a 100 mm f theta scan lens and scanning at 1 m/s with the GaAs wafer in the focal plane of the focused beam. The scribe line is a very shallow groove with a relatively narrow kerf width of about 37 μm. In this example, the fluence generated on the backside region of the GaAs wafer is about 2 MW/cm$^2$.

Accordingly, thermal processing by transmission of mid infra-red laser light through a semiconductor substrate, such as silicon or gallium arsenide, consistent with embodiments described herein, allows thermal processing (e.g., in semiconductor device manufacturing) without requiring a direct line of sight to a target material.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:

1. A method of thermal processing by mid infra-red laser transmission, the method comprising:
   generating laser light from a rare-earth-doped fiber laser in a spectral range of 1300 to 5000 nm; and
   directing the laser light through a semiconductor substrate, the semiconductor substrate being sufficiently transparent to the laser light in the spectral range of 1300 to 5000 nm such that the laser light transmitted through the semiconductor substrate has a transmitted power capable of altering a target material at a back side region of the semiconductor substrate, wherein the target material absorbs laser energy from the laser light transmitted through the semiconductor substrate to alter the target material.

2. The method of claim 1 wherein the laser light is continuous wave (CW) laser light.

3. The method of claim 2 further comprising temporally modulating the CW laser light before directing the laser light through the semiconductor substrate.

4. The method of claim 1 wherein the laser light is generated in a spectral range of 1700 to 5000 nm.

5. The method of claim 1 wherein the laser light is generated in a 2 µm spectral region.

6. The method of claim 1 wherein the rare-earth-doped fiber laser is a thulium fiber laser.

7. The method of claim 1 wherein the rare-earth-doped fiber laser is a 1940 nm thulium fiber laser.

8. The method of claim 1 wherein the semiconductor substrate has a limited mid infra-red transmission range.

9. The method of claim 1 wherein the semiconductor substrate is a gallium arsenide (GaAs) substrate.

10. The method of claim 1 wherein the transmitted power is at least about 50% of an input power of the laser light generated by the rare-earth-doped fiber laser.

11. The method of claim 1 wherein the transmitted power is at least about 80% of an input power of the laser light generated by the rare-earth-doped fiber laser.

12. The method of claim 1 wherein the target material is deposited on the semiconductor substrate at the back side region of the semiconductor substrate.

13. The method of claim 1 wherein the target material is spaced from the semiconductor substrate at the back side region of the semiconductor substrate.

14. The method of claim 1 wherein altering the material includes thermally altering the material selected from the group consisting of ablating, annealing, and melting.

15. The method of claim 1 wherein the laser light alters the target material without altering material of the semiconductor substrate.

16. The method of claim 1 wherein the semiconductor substrate is a gallium arsenide (GaAs) substrate, and wherein altering the material on the back side region includes ablating a germanium substrate located on the back side of the GaAs substrate.

17. The method of claim 1 wherein directing the laser light includes focusing the laser light.

18. The method of claim 1 wherein directing the laser light includes scanning the laser light to scribe the material at the back side region.

19. A method of thermal processing by mid infra-red laser transmission, the method comprising:

generating continuous wave (CW) laser light from a thulium-doped fiber laser in a 2 µm spectral region; and directing the laser light through a substrate, the substrate being sufficiently transparent to the laser light in the 2 µm spectral region such that the laser light transmitted through the substrate has a transmitted power capable of thermally altering a target material at a back side region of the substrate without altering material of the substrate, wherein the target material absorbs laser energy from the laser light transmitted through the substrate to alter the target material.

20. The method of claim 19 wherein the transmitted power is at least about 50% of an input power of the laser light generated by the thulium fiber laser.

* * * * *